United States Patent [19]

Debrabander

[11] Patent Number: 4,571,016
[45] Date of Patent: Feb. 18, 1986

[54] INDICATOR LIGHT FOR PRINTED CIRCUITS

[75] Inventor: Armand Debrabander, Milly la Foret, France

[73] Assignee: Vibrachoc, Saint-Cloud, France

[21] Appl. No.: 486,986

[22] Filed: Apr. 20, 1983

[30] Foreign Application Priority Data

Apr. 21, 1982 [FR] France .................. 82 06834

[51] Int. Cl.4 ............................................. H05K 1/16
[52] U.S. Cl. .............................. 339/17 D; 339/127 R
[58] Field of Search ............ 339/17 D, 127 R, 127 C

[56] References Cited

U.S. PATENT DOCUMENTS

| | | | |
|---|---|---|---|
| 2,884,609 | 4/1959 | Fraser et al. | 339/17 D |
| 2,892,992 | 6/1959 | Grovemiller et al. | 339/17 D |
| 2,953,769 | 9/1960 | Woofter et al. | 339/17 D |
| 3,403,370 | 9/1968 | Carpenter | 339/127 R |
| 3,555,341 | 1/1971 | Curtis | 339/127 C |

FOREIGN PATENT DOCUMENTS 1424780 12/1966 France .
1464598  2/1977 United Kingdom .

*Primary Examiner*—Gil Weidenfeld
*Assistant Examiner*—Thomas M. Kline
*Attorney, Agent, or Firm*—Larson and Taylor

[57] ABSTRACT

The indicator light has an insulating support (1) of flattened shape defining a cylindrical edge (9) with an extension (8) in the form of a flange adapted to be applied against one of the sides of the printed circuit, and resilient strips (18) provided with ends in the shape of a ramp for application against the other side of the printed circuit carrying the paths, clipping devices permitting a locking in the required position in cooperation with notches of the aperture of the printed circuit.

12 Claims, 6 Drawing Figures

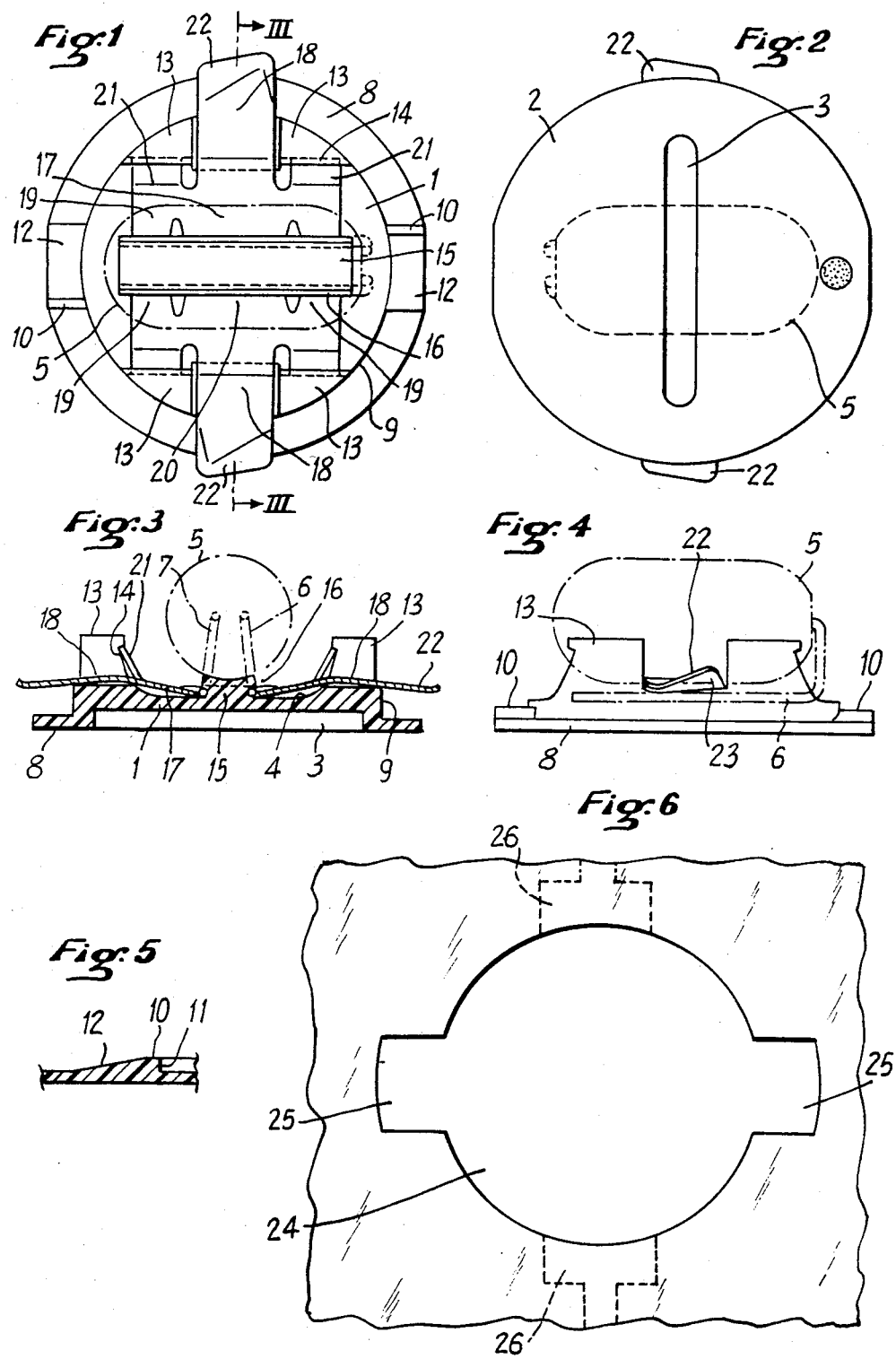

INDICATOR LIGHT FOR PRINTED CIRCUITS

The invention relates to an indicator light provided with a light source and fixing means for fixing it to a printed circuit while ensuring at the same time the electric continuity with at least two paths of the circuit for supplying current to the indicator, comprising an insulating support defining a cylindrical annular edge whose diameter is slightly less than the diameter of a corresponding punched aperture in the printed circuit, said support being provided, on one side of said edge, with a radial extension adapted to bear against that one of the sides of the printed circuit which does not have said paths, said support supporting, on the other side of the annular edge, at least two conductive metal strips disposed substantially radially and capable of being put in contact with the terminals of the light source supported by said support, said strips extending radially beyond said annular edge so as to form two ends capable of passing through the punched aperture in the printed circuit owing to punched radial notches, the rotation of the support then bringing the ends of the strips in contact with the side of the printed circuit carrying the paths with a resilient deformation of the strips which tends to maintain the indicator light clamped against the printed circuit.

Known indicator lights of this type (FR-A-1, No. 424,780 and GB-A-1, No. 464,598) have a very large overall size in the plan perpendicular to the board receiving them, which constitutes a particularly troublesome drawback.

The invention has for object to overcome this drawback by providing an indicator light which is simple and easy to construct and particularly rapid to place in position.

For this purpose, the indicator light according to the invention is essentially characterized in that said insulating support has a flat shape, means being provided for locking on the support free wires of the light source and forming an electric continuity between said wires and said strips.

Preferably, said strips are each formed by a metal contact element capable of being put into electric contact with the wires of the light source and fixed on the support by a clipping arrangement.

Said metal contact element advantageously has a plurality of tabs for clipping it between grooves or projections on, on one hand, bosses of the support and, on the other hand, on a central projection extending diametrally, said clipping tabs locking the free wires of the light source and forming the electric continuity.

In an advantageous embodiment, said ends of the strips are inclined so as to form ramps cooperating with the printed circuit so as to cause said ends to pass over the edge of the radial punched notch, and thereafter contact the corresponding side of the printed circuit.

Again, preferably, the indicator light is provided with means for immobilizing in the required angular position, which means advantageously comprise projections diposed radially in relief relative to said cylindrical edges and angularly offset relative to the resilient strips so as to clip into the punched notches of the printed circuit under the resilient return action of said strips. Said projections may be connected to said radial extensions by a ramp which is inclined in the direction of rotation which is the reverse of that enabling the indicator light to be placed on the printed circuit Further advantages and features of the invention will be apparent from the following description which is given by way of a non-limiting example with reference to the accompanying drawing in which:

FIG. 1 represents diagrammatically the top of an indicator light according to the invention.

FIG. 2 represents the bottom of said indicator light.

FIG. 3 represents a diagrammatic sectional view taken along line III—III of FIG. 1.

FIG. 4 represents the side elevational view of this device.

FIG. 5 represents a cross-sectional side elevation view of a locking projection of this device.

FIG. 6 represents a plan view of a punched aperture in a board having printed circuits.

The indicator light according to the invention, as illustrated, comprises first of all a support 1 of insulating material, for example of plastics material, having generally the shape of a flattened disc with one practically circular lower side 2, provided with a longitudinal recess 3, and an opposite second side 4 for receiving the strips and the light source, in the present instance a bulb 5 having two free wires 6 and 7.

The periphery of the support 1 forms a substantially circular flange 8 from which extends a cylindrical annular edge 9 whose height is, for example, equal to the thickness of the printed circuit adapted to receive the indicator light. On the side of the edge 9, the flange 8 has, in two diametrically opposed places, two radial bosses or reliefs 10 whose face 11 disposed on the counterclockwise side in steep and perpendicular to the plane of the flange 8 while the other face is extended by a ramp 12 progressively joining the flange 8.

On its side 4, the support 1 has two pairs of two bosses 13, two bosses of one pair defining therebetween a radial passage, the two passages thus formed being in alignment on a diameter perpendicular to the diameter joining the ramps 12. On the inward side, each of the bosses has an inner groove 14 in the vicinity of the boss. Further, the side 4 has, in its central part, a diametrally elongated projection 15 whose upper surface may be advantageously curved in the manner of a concave cylinder so as to be adapted to the cylindrical periphery of the bulb 5, this projection 15 being bordered by two parallel grooves 16, the various grooves 14 and 16 being all parallel.

Thus it is possible to place in position two metal contact elements 17 having a rectangular part and a radial strip 18. Each element 17 has on its edge directed toward the central projection 15 two notches defining two lateral short tabs 19 and a central tab 20, the central tab 20 extending obliquely downwardly and toward the groove 16 while the lateral tabs 19 extend more upwardly, i.e. toward the upper part of the grooves 16.

Near the outside, the elements 17 have, on each side of the strip 18, two upwardly obliquely extending tabs 21 which extend into the grooves 14 of the bosses 13.

It will therefore be understood that it is thus possible to clip the elements 17 in position as can be seen in FIGS. 1 and 3, each element 17 bearing by its inner tabs 19, 20 against the wire 6 or 7 which was previously placed in the bottom of the grooves 16 of the projection 15, while the tabs 21 enter under resilient stress, the grooves 14 so that the contact element 17 is immobilized with the strip 18 passing radially through the passage defined between the two bosses 13 disposed on its side. In doing so, each element 17 is in electric contact with the wire 6 or 7 of the bulb or light source 5.

The ends 22 of the strips 18 extend radially beyond the annular edge 9 and, as can be seen in particular in FIG. 4 they are bent in the manner of two blades of an aircraft propeller so as to form on their faces oriented toward the flange 8, two ramps 23 which approach the flange 8 in the clockwise direction. Further, it will be understood that the aforementioned placing in position of the elements 17 has applied the strips 18, which extend them, with a resilient stress against the side 4 of the support.

In order to place an indicator light on a board, there is punched in the latter an aperture 24 of generally circular shape with a diameter very slightly larger than the diameter of the edge 9, this aperture 24 being extended however by two diametrally opposed notches 25 which have a sufficient radial and tangential extent to permit the passage of the ends 22 of the strips 18. With the printed circuit for example disclosed horizontally with its paths 26 carried by the lower side facing the ground, the indicator light is presented above the upwardly facing side of the printed circuit, the light source 5 and the strips 18 facing downwardly. The indicator light is then inserted in the aperture 24 by passing the ends 22 of the strips 18 in the notches 25, and then it is rotated in the counter-clockwise direction. The ramps 23 then come in contact with the lower side of the printed circuit and the rotation can be continued owing to the fact that the ramps 23 allow the strips 18 to rise progressively under the effect of the thickness of the printed circuit while the projections 10 remain applied against the upper side of the printed circuit.

When the rotation is continued for a quarter of a turn, it will be understood that the projections 10 are placed in front of the notches 25 and the resilient force exerted by the strips 18 then causes the projections 10 to enter the notches so that the flange 8 is applied against the upper side of the printed circuit and the ends 22 are applied, on the other side of the printed circuit, against the conductive paths 26 and then establish the electric continuity between the paths and the light source 5.

In this locked position, continued rotation in the same direction is impossible since the faces 11 of the projections 10 abut against the corresponding edge of the notch 25. On the other hand, a rotation in the opposite direction, i.e. in the clockwise direction, is allowed for the disassembly but can only be produced by exerting on the support a sufficient torque to overcome the resistance opposed by the resilient bearing force of the strips 18, owing to the ramp effect produced by the contact of the ramp 12 with the edge of the notch 25 opposite that disposed in the vicinity of the face 11 of the projection 10.

It will be understood that it was thus possible to construct an indicator light which is easy to mass-produce, it being composed simply of a support which may be easily moulded, two blanked-out metal contact elements and a bulb or other light source.

Of course, the invention may have various variants normally within the capability of one skilled in the art. Thus, the number and the shape of the strips and locking projections may vary. Likewise, the function of the flange 8 may be performed by radial arms disposed in its place. The details of the mounting and clipping of the contact elements 17 may also vary and the same is more generally true of the various embodiments of the invention.

I claim:

1. An indicator light structure comprising:

a light source having two free terminal elements provided with contact portions;

a generally flat disk-shaped insulating support carrying said light source;

a printed circuit board having on one side of said board at least two circuit paths for supplying current to said light source;

fixing and connecting means for fixing said light source to said printed circuit board and connecting said two circuit paths to said two terminal elements, said fixing and connecting means comprising (a) a circular aperture having two notches provided in said printed circuit board, (b) a cylindrical annular edge portion defined on said support and having a diameter slightly less than the diameter of said aperture, (c) an extension portion extending radially from said annular edge portion on a first side of said support and in bearing relation to the other side of said printed circuit board opposed to said one side of said printed circuit board, (d) at least two electrically conductive metal strips disposed on and extending substantially radially on said support on a second side of said support to said first side, said metal strips extending substantially radially of said support beyond said annular edge portion so as to form two substantially radially extending end portions which pass through said notches of said aperture when initially assembling said support with said printed circuit board, which said end portions, after having been passed through said notches and been rotated in said board, are in contact with a respective one of said two circuit paths on said one side of said printed circuit board by a resilient deformation of said metal strips which tends to maintain said support clamped against said board, (e) means for locking said two terminal elements to said support in respective electric contact with said two metal strips including a pair of grooves in which a respective said contact portion of said two free terminal elements is located and into which a respective one of said two electrically conductive metal strips extends in contact with the associated said contact portion, and wherein each of said metal strips includes a contact element fixed on said support and a clipping means for resiliently clipping each respective said contact element against said respective contact portion in said groove of said support, said clipping means comprising (a) a plurality of metal tabs on each contact element, (b) bosses on said support in which second grooves are defined, and (c) a diametrically extending central projection on said support in which said first-mentioned grooves are located, said tabs locking said contact portions of said terminal elements of said light source in position on said support and electrically contacting said terminal elements.

2. An indicator light structure according to claim 1, wherein said end portions of said strips are inclined so as to form a ramp means cooperative with said printed circuit board for passing said end portions over an edge of respective said notches and then into contact with a respective said side of said printed circuit board.

3. An indicator light structure according to claim 1, and further comprising a means for immobilizing said support rotationally relative to said printed circuit board.

4. An indicator light structure according to claim 3, wherein said immobilizing means comprises projections which project radially from said cylindrical edge portion and which are angularly offset relative to said resilient strips such that said projections clip into said notches of said printed circuit board under a resilient return action of said strips.

5. An indicator light structure according to claim 4, wherein said radially projecting projections are connected to said radially extending extension portion by a ramp which is inclined in a direction of rotation which is the reverse of the rotation of said support when placing said support and said light source on said printed circuit board.

6. An indicator light structure according to claim 1, wherein said radially extending extension portion is a flange.

7. An indicator light structure comprising:
a light source having two free terminal elements provided with contact portions;
a generally flat disk-shaped insulating support carrying said light source;
a printed circuit board having on one side of said board at least two circuit paths for supplying current to said light source;
fixing and connecting means for fixing said light source to said printed circuit board and connecting said two circuit paths to said two terminal elements, said fixing and connecting means comprising
(a) a circular aperture having two notches provided in said printed circuit board,
(b) a cylindrical annular edge portion defined on said support and having a diameter slightly less than the diameter of said aperture,
(c) an extension portion extending radially from said annular edge portion on a first side of said support and in bearing relation to the other side of said printed circuit board opposed to said one side of said printed circuit board,
(d) at least two electrically conductive metal strips disposed on and extending substantially radially on said support on a second side of said support opposed to said first side, said metal strips extending substantially radially of said support beyond said annular edge portion so as to form two substantially radially extending end portions which pass through said notches of said aperture when intially assembling said support with said printed circuit board, which said end portions, after having been passed through said notches and been rotated in said board, are in contact with a respective one of said two circuit paths on said one side of said printed circuit board by a resilient deformation of said metal strips which tends to maintain said support clamped against said board,
(e) means for locking said two terminal elements to said support in respective electric contact with said two metal strips including a pair of grooves in which a respective said contact portion of said two free terminal elements is located and into which a respective one of said two electrically conductive metal strips extends in contact with the associated said contact portion, and
wherein each of said metal strips includes a contact element fixed on said support and a clipping means for resiliently clipping each respective said contact element against said respective contact portion in said groove of said support, said clipping means comprising (a) a plurality of metal tabs on each contact element, (b) projections defined by bosses on the support, and (c) a diametrically extending central projection on said support in which said first-mentioned grooves are located, said tabs locking said contact portions of said terminal elements of said light source in position in said grooves and on said support and providing electrical contact to said terminal elements.

8. An indicator light structure according to claim 7, wherein said end portions of said strips are inclined so as to form a ramp means cooperative with said printed circuit board for passing said end portions over an edge of said respective said notches and then into contact with a respective said side of said printed circuit board.

9. An indicator light structure according to claim 7, and further comprising a means for immobilizing said support rotationally relative to said printed circuit board.

10. An indicator light structure according to claim 9, wherein said immobilizing means comprises projections which project radially from said cylindrical edge portion and which are angularly offset relative to said resilient strips such that said projections clip into said notches of said printed circuit board under a resilient return action of said strips.

11. An indicator light structure according to claim 10, wherein said radially projecting projections are connected to said radially extending extension portion by a ramp which is inclined in a direction of rotation which is the reverse of the rotation of said support when placing said support and said light source on said printed circuit board.

12. An indicator light structure according to claim 7, wherein said radially extending extension portion is a flange.

* * * * *